United States Patent
Roychowdhury et al.

(10) Patent No.: US 11,609,549 B2
(45) Date of Patent: Mar. 21, 2023

(54) TRANSFER LEARNING/DICTIONARY GENERATION AND USAGE FOR TAILORED PART PARAMETER GENERATION FROM COUPON BUILDS

(71) Applicant: General Electric Company, Schenectady, NY (US)

(72) Inventors: Subhrajit Roychowdhury, Schenectady, NY (US); Alexander Chen, Cypress, CA (US); Xiaohu Ping, Niskayuna, NY (US); John Erik Hershey, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/360,790

(22) Filed: Jun. 28, 2021

(65) Prior Publication Data
US 2021/0325849 A1    Oct. 21, 2021

Related U.S. Application Data

(63) Continuation of application No. 16/284,409, filed on Feb. 25, 2019, now Pat. No. 11,079,739.

(51) Int. Cl.
*G05B 19/4099* (2006.01)
*B33Y 50/00* (2015.01)
(Continued)

(52) U.S. Cl.
CPC ........ *G05B 19/4099* (2013.01); *B29C 64/386* (2017.08); *B33Y 50/00* (2014.12);
(Continued)

(58) Field of Classification Search
CPC ...... G05B 19/4099; G05B 2219/33034; G05B 2219/35134; G05B 2219/49007;
(Continued)

(56) References Cited

U.S. PATENT DOCUMENTS

| | | |
|---|---|---|
| 7,181,296 B2 | 2/2007 | Rotariu et al. |
| 8,509,933 B2 | 8/2013 | Steingart et al. |

(Continued)

FOREIGN PATENT DOCUMENTS

| | | |
|---|---|---|
| CN | 104504535 B | 9/2018 |
| CN | 104200087 B | 10/2018 |
| WO | 2017205555 | 11/2017 |

OTHER PUBLICATIONS

International Searching Authority, "Search repod and Written Opinion," issued in connection with PCT patent application No. PCT/US2020/018558, dated May 28, 2020, 12 pages.
(Continued)

*Primary Examiner* — Chad G Erdman
(74) *Attorney, Agent, or Firm* — Hanley, Flight & Zimmerman, LLC

(57) ABSTRACT

According to some embodiments, system and methods are provided comprising receiving, via a communication interface of a part parameter dictionary module comprising a processor, geometry data for a plurality of geometric structures forming a plurality of parts, wherein the parts are manufactured with an additive manufacturing machine; determining, using the processor of the part parameter dictionary module, a feature set for each geometric structure; generating, using the processor of the part parameter dictionary module, one of a coupon and a coupon set for the feature set; generating an optimized parameter set for each coupon, using the processor of the part parameter dictionary module, via execution of an iterative learning control process for each coupon; mapping, using the processor of the part parameter dictionary module, one or more parameters of the optimized parameter set to one or more features of the feature set; and generating a dictionary of optimized scan parameter sets to fabricate geometric structures with a
(Continued)

material used in additive manufacturing. Numerous other aspects are provided.

17 Claims, 10 Drawing Sheets

(51) Int. Cl.
  *B29C 64/386* (2017.01)
  *B29C 64/153* (2017.01)
  *B22F 10/20* (2021.01)
  *B22F 10/30* (2021.01)

(52) U.S. Cl.
  CPC ............ *B22F 10/20* (2021.01); *B22F 10/30* (2021.01); *B29C 64/153* (2017.08); *G05B 2219/33034* (2013.01); *G05B 2219/35134* (2013.01); *G05B 2219/49007* (2013.01)

(58) Field of Classification Search
  CPC ........ G05B 2219/49018; B29C 64/386; B29C 64/153; B29C 64/393; B33Y 50/00; B33Y 10/00; B33Y 50/02; B22F 10/20; B22F 10/30; B22F 12/00; Y02P 10/25; Y02P 90/02; G06F 30/27
  See application file for complete search history.

(56) References Cited

U.S. PATENT DOCUMENTS

| | | | |
|---|---|---|---|
| 9,999,924 B2 | 6/2018 | Dave et al. | |
| 10,073,424 B2 | 9/2018 | Lin et al. | |
| 10,611,092 B2 | 4/2020 | Buller et al. | |
| 2012/0219698 A1 | 8/2012 | Steingart et al. | |
| 2015/0045928 A1 | 2/2015 | Perez et al. | |
| 2015/0235143 A1 | 8/2015 | Eder | |
| 2015/0331402 A1 | 11/2015 | Lin et al. | |
| 2017/0277168 A1* | 9/2017 | Tanaka | B29C 64/386 |
| 2018/0018810 A1* | 1/2018 | Morovic | G06T 15/10 |
| 2018/0136633 A1 | 5/2018 | Small et al. | |
| 2019/0001655 A1 | 1/2019 | Blom et al. | |
| 2019/0004079 A1 | 1/2019 | Blom et al. | |
| 2019/0283333 A1 | 9/2019 | Hwang et al. | |
| 2019/0362543 A1* | 11/2019 | Zeng | G06F 30/00 |
| 2020/0004225 A1 | 1/2020 | Buller et al. | |
| 2020/0143006 A1* | 5/2020 | Matusik | B29C 64/393 |
| 2020/0272127 A1 | 8/2020 | Roychowdhury et al. | |
| 2021/0201562 A1* | 7/2021 | Shepherd | G06T 15/08 |

OTHER PUBLICATIONS

United States Patent and Trademark Office, "Notice of Allowance," issued in connection with U.S. Appl. No. 16/284,409, filed Mar. 26, 2021, 14 pages.

United States Patent and Trademark Office, "Non-Final Office action," issued in connection with U.S. Appl. No. 16/284,409, filed Jun. 10, 2020, 24 pages.

* cited by examiner

600

| Feature/parameter mapping | 412 |
|---|---|
| Feature set (volume fraction) | Optimized parameter set (power) |
| 0.1 | 100 W |
| 0.2 | 120 W |
| 0.3 | 190 W |
| 0.4 | 200 W |
| 0.5 | 210 W |
| 0.6 | 230 W |
| 0.7 | 290 W |
| 0.8 | 300 W |
| 0.9 | 310 W |
| 1.0 | 310 W |

Dictionary: material

| Geometric structure | Feature | Parameters |
|---|---|---|
| Overhang | Low volume fraction | Low power |
| Thinwall | Low volume fraction | Low power |
| Bulk | High volume fraction | High power |
| Edges | Medium volume fraction | Medium power |

TRANSFER LEARNING/DICTIONARY GENERATION AND USAGE FOR TAILORED PART PARAMETER GENERATION FROM COUPON BUILDS

CROSS-REFERENCE TO RELATED APPLICATIONS

This patent arises from U.S. Non-Provisional patent application Ser. No. 16/284,409, which was filed on Feb. 25, 2019. U.S. Non-Provisional patent application Ser. No. 16/284,409 is hereby incorporated herein by reference in its entirety. Priority to U.S. Non-Provisional patent application Ser. No. 16/284,409 is hereby claimed.

BACKGROUND

Additive manufacturing (AM) processes are used to fabricate precision three-dimensional objects from a digital model. Such objects are fabricated using an additive process performed by an additive manufacturing machine (AMM) under computer control to create an object using digital model data from a 3D model. The AMM may form the object by solidifying successive layers of material one on top of the other on a build plate. Some AM systems use a laser (or similar energy source) and a series of lenses and mirrors to direct the laser over a powdered material in a pattern provided by a digital model (e.g., powder-bed AM, an example of which is direct metal laser sintering (DMLS)). The laser solidifies the powdered material by sintering or melting the powdered material. The term "direct metal laser melting" (DMLM) may more accurately reflect the nature of this process since it typically achieves a fully developed, homogenous melt pool and fully dense bulk upon solidification. The nature of the rapid, localized heating and cooling of the melted material enables near-forged material properties, after any necessary heat treatment is applied.

The DMLS process uses a 3D computer-aided design (CAD) model of the object to be manufactured, whereby a CAD model data file is created and sent to the fabrication facility. A technician may work with the 3D model to properly orient the geometry for part building and may add supporting structures to the design, as necessary. Once this "build file" has been completed, it is "sliced" into layers of the proper thickness for the particular DMLS fabrication machine and downloaded to the machine to allow the build to begin. The metal powder on the build plate is fused into a solid part by melting it locally using the focused laser beam. In this manner, parts are built up additively, layer by layer. This process allows for highly complex geometries to be created directly from the 3D CAD data, automatically and without any tooling. DMLS produces parts with high accuracy and detail resolution, good surface quality, and excellent mechanical properties.

In conventional additive manufacturing practice, a part build plan (PBP) is generated for a particular part design and is executed by the additive manufacturing machine (AMM). Based on the PBP, the AMM controls multiple build parameters that are applied during the build, including the travel path of the material addition zone and parameters governing the application and processing of the material added to the part in the zone. In general, there is a complex relationship between these parameters and the quality of the built part.

The design of the PBP is an iterative process, which includes building a part based on a trial PBP, followed by assessment of the resulting trial part quality, and then modification of the trial PBP to adjust the expected part quality, building the next part, followed by assessment, etc. This iteration of trial PBPs to meet overall manufacturing requirements, such as part quality and production rate, may require multiple iterations to attain the desired manufacturing requirements. Conventionally, assessment of the trial part quality is done by experimental testing of the part using either destructive or non-destructive techniques. In particular, DMLS parts may be sectioned, optical micrographs produced from the processed section, and the micrographs processed to quantify anomalies. The assessment of trial part quality is based on such tests. Such testing is laborious, expensive, and time-consuming, and significantly increases the time and cost of developing an acceptable PBP to release to final production.

A challenge in powder-based AM, is that multiple parts may need to be fabricated multiple times for testing before an acceptable PBP is generated.

Therefore, it would be desirable to provide a system and method that optimizes the build time for the part.

BRIEF DESCRIPTION

According to some embodiments, a method includes receiving, via a communication interface of a part parameter dictionary module comprising a processor, geometry data for a plurality of geometric structures forming a plurality of parts, wherein the parts are manufactured with an additive manufacturing machine; determining, using the processor of the part parameter dictionary module, a feature set for each geometric structure; generating, using the processor of the part parameter dictionary module, one of a coupon and a coupon set for the feature set; generating an optimized parameter set for each coupon, using the processor of the part parameter dictionary module, via execution of an iterative learning control process for each coupon; mapping, using the processor of the part parameter dictionary module, one or more parameters of the optimized parameter set to one or more features of the feature set; and generating a dictionary of optimized scan parameter sets to fabricate geometric structures with a material used in additive manufacturing.

According to some embodiments, a system includes a part parameter dictionary module including a processor; and a memory storing program instructions, the part parameter dictionary module operative with the program instructions to perform the functions as follows: receive geometry data for a plurality of geometric structures forming a plurality of parts, wherein the parts are manufactured with an additive manufacturing machine; determine a feature set for each geometric structure; generate one of a coupon and a coupon set for the feature set; generate an optimized parameter set for each coupon via execution of an iterative learning control process for each coupon; map one or more parameters of the optimized parameter set to one or more features of the feature set; generate a dictionary of optimized scan parameter sets to fabricate geometric structures with a material used in additive manufacturing.

According to some embodiments, a non-transitory computer readable medium includes receiving, via a communication interface of a part parameter dictionary module comprising a processor, geometry data for a plurality of geometric structures forming a plurality of parts, wherein the parts are manufactured with an additive manufacturing machine; determining, using the processor of the part parameter dictionary module, a feature set for each geometric structure; generating, using the processor of the part parameter dictionary module, one of a coupon and a coupon set for the feature set; generating an optimized parameter set for each coupon, using the processor of the part parameter dictionary module, via execution of an iterative learning control process for each coupon; mapping, using the processor of the part parameter dictionary module, one or more parameters of the optimized parameter set to one or more features of the feature set; and generating a dictionary of optimized scan parameter sets to fabricate geometric structures with a material used in additive manufacturing.

A technical effect of some embodiments of the invention is an improved technique and system for fabricating parts via AM processing. Some embodiments provide for the generation of a dictionary of optimized scan parameter sets (e.g., laser parameters—the input powers, speeds, focuses, locations of laser strikes through the part, etc.), and feature characteristics of a predefined coupon build. Embodiments may use an iterative learning control (ILC) process on coupons of part geometries to generate the dictionary. The dictionary may then be used to generate a tailored optimal scan parameter set/strategy for building a complex part. A feature of the feature sets may include thermal leakage, for example. With the non-exhaustive thermal leakage example, a thermal leakage map of the complex part may be computed, and the dictionary for a particular material may be referenced with respect to the thermal leakage feature to derive the scan parameter set of the part without actually building the complex part. A technical effect of some embodiments is a compression of the material timeline development, as well as a reduction in the time and cost of material/part parameter development compared to conventional AM processes. Another technical effect of some embodiments is a reduction in material debits associated with sub-optimal segmentation. In traditional systems, lines may be broken into segments, and a seam may be created in the regions where the parameters change. Seams are potential failure points due to material property debits. One or more embodiments do not start and stop within the segments, hence no seam is created and no material debit is created. Some embodiments may also provide for higher quality parts, as well as "first time right" (e.g., using the dictionary process, as described further below, better parameters may be provided at the outset, thereby reducing the number of times needed for manual iteration and development). With this and other advantages and features that will become hereinafter apparent, a more complete understanding of the nature of the invention can be obtained by referring to the following detailed description and to the drawings appended hereto.

Other embodiments are associated with systems and/or computer-readable medium storing instructions to perform any of the methods described herein.

DRAWINGS

Figure 3A:
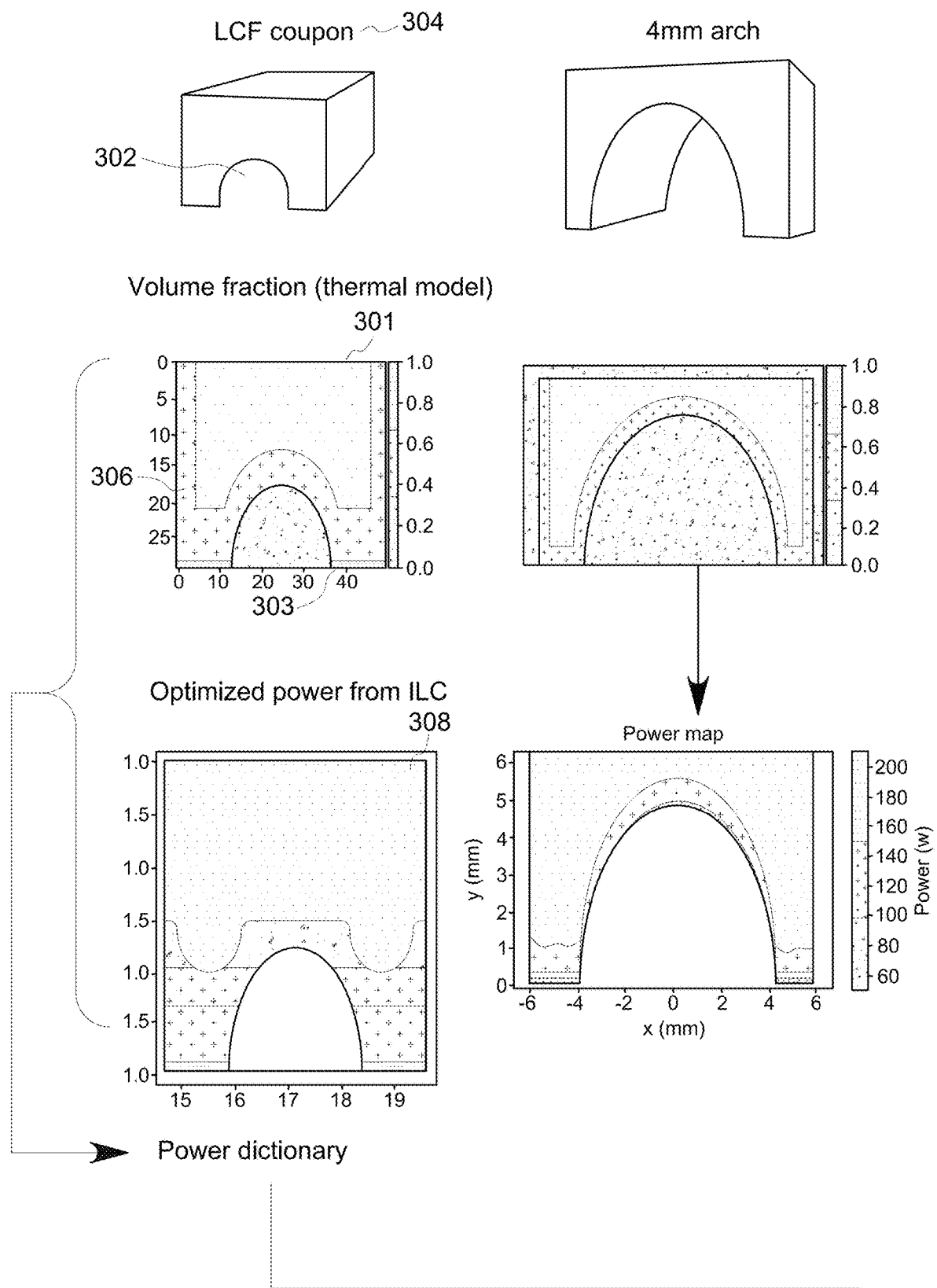
Figure 3B:
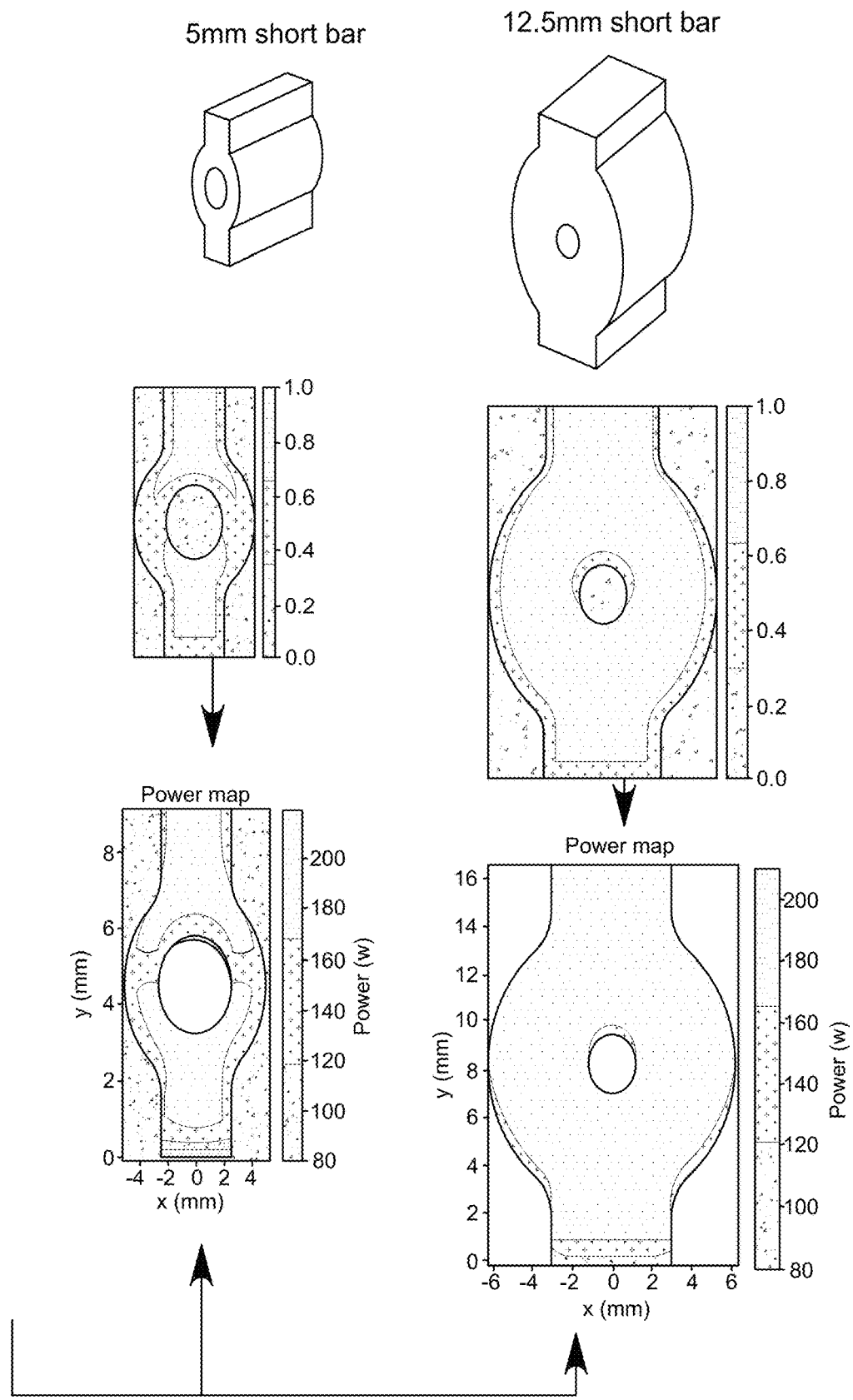
Figure 3C:
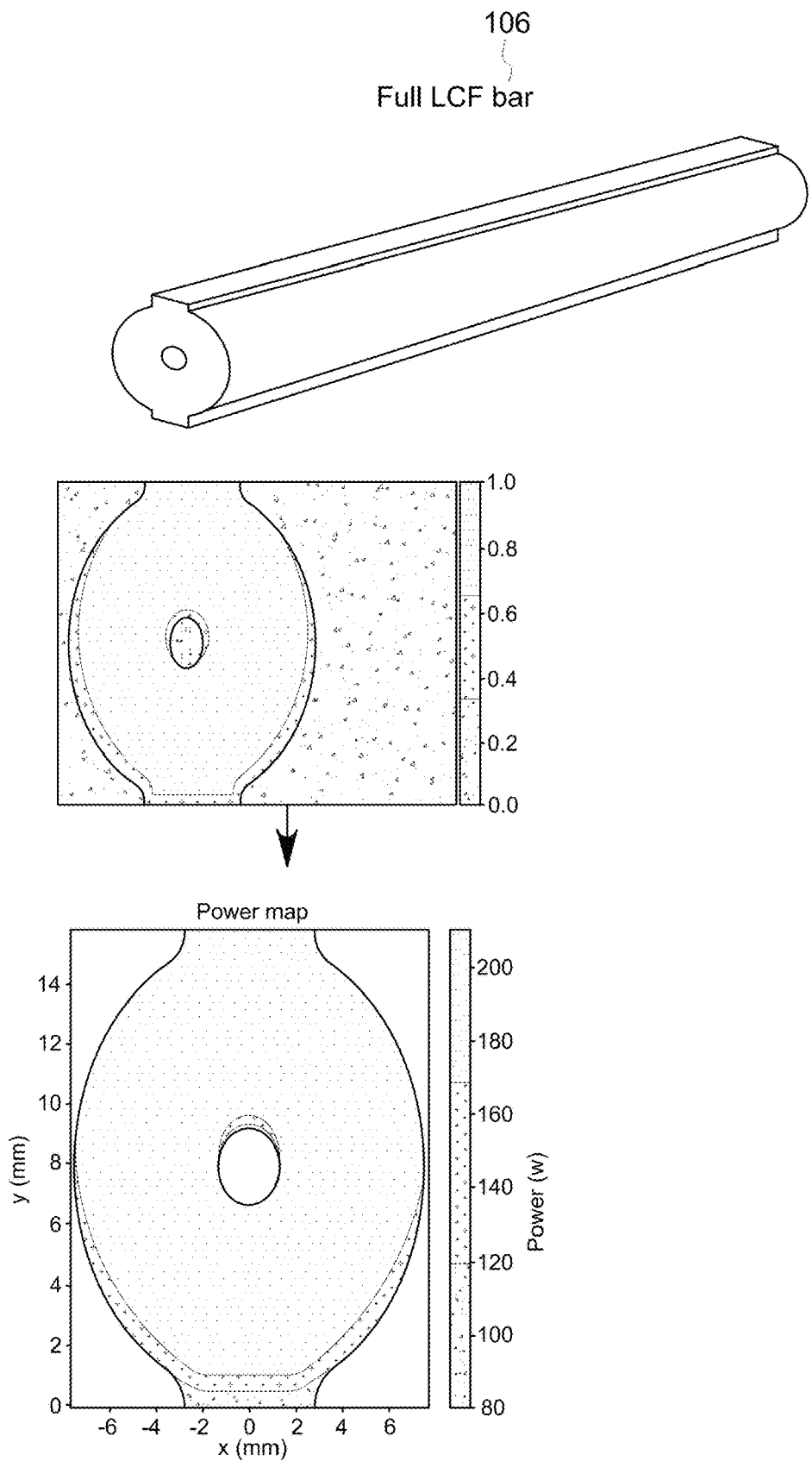

FIGS. 3A-C illustrate a coupon and map diagram according to some embodiments.

Figure 4:
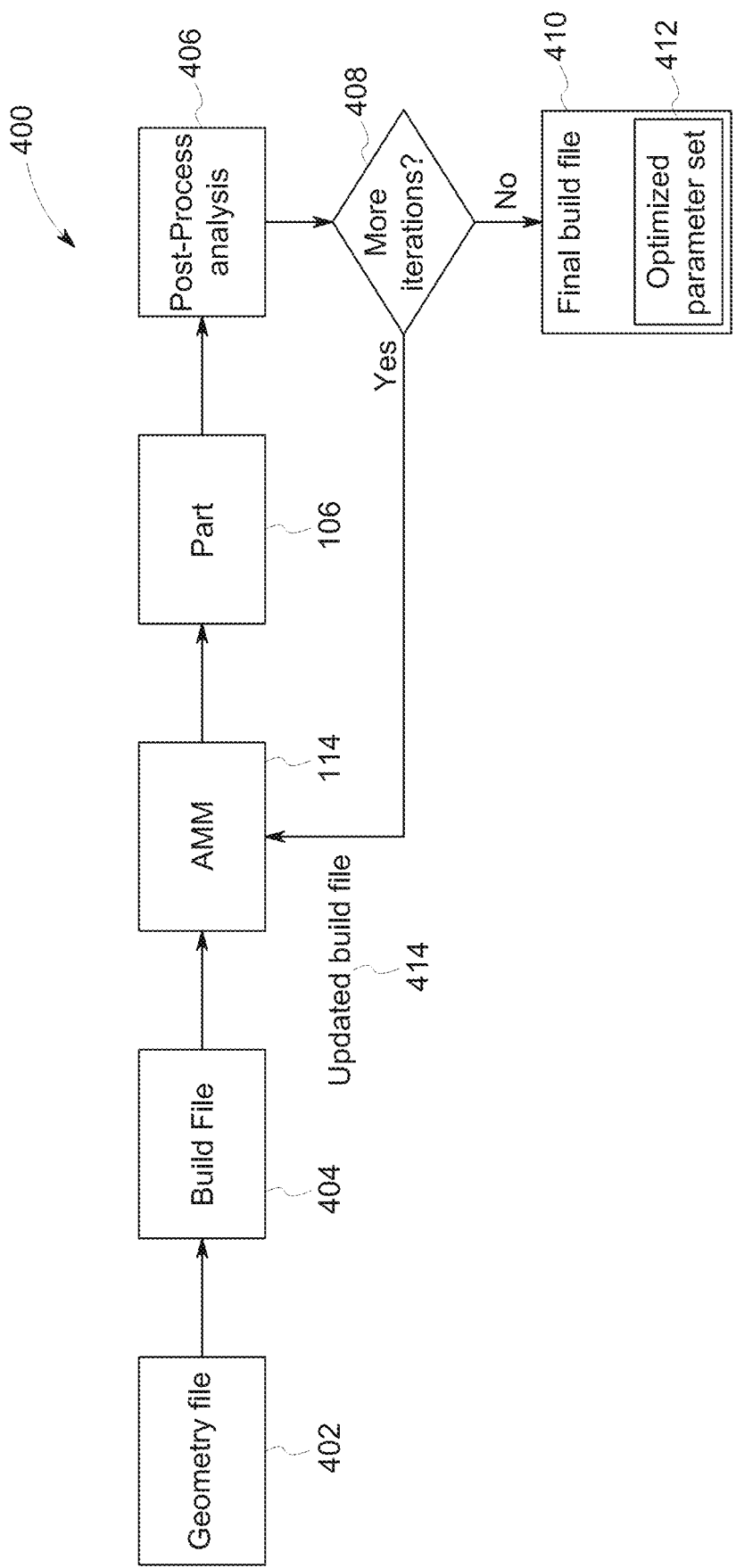

FIG. 4 illustrates a block diagram according to some embodiments.

Figure 5:
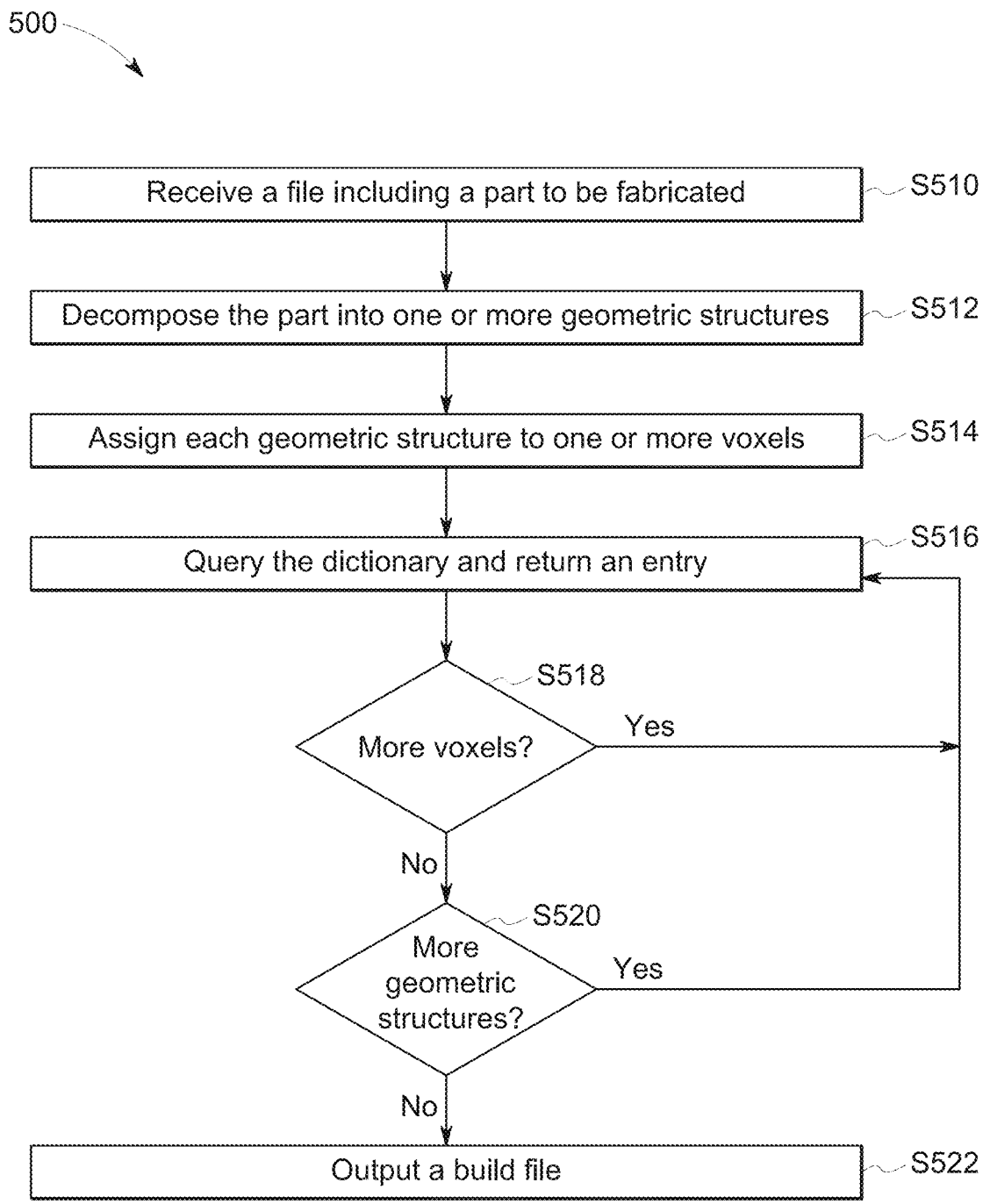

FIG. 5 illustrates a flow diagram according to some embodiments.

FIG. 6 illustrates a chart according to some embodiments.

FIG. 7 illustrates a chart according to some embodiments.

Figure 8:
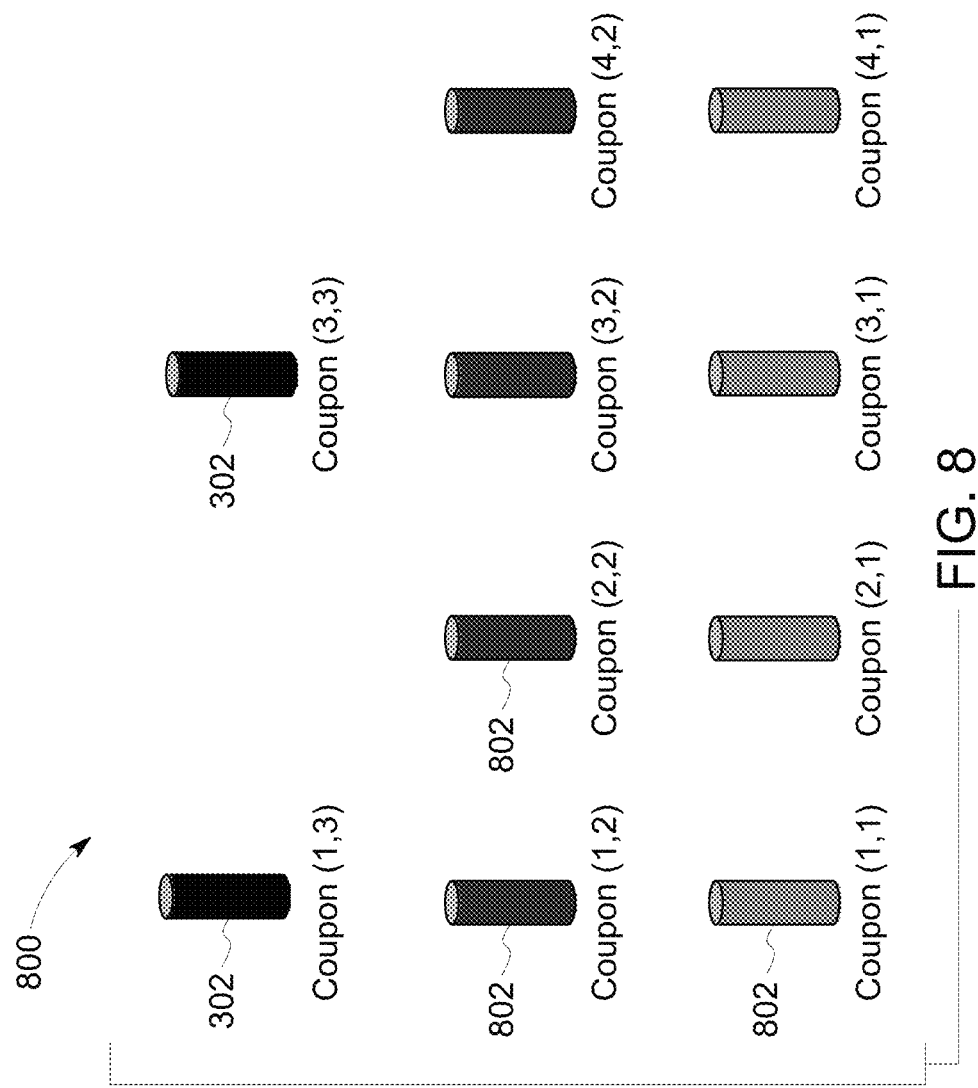

FIG. 8 illustrates dictionary entries according to some embodiments.

Figure 9:
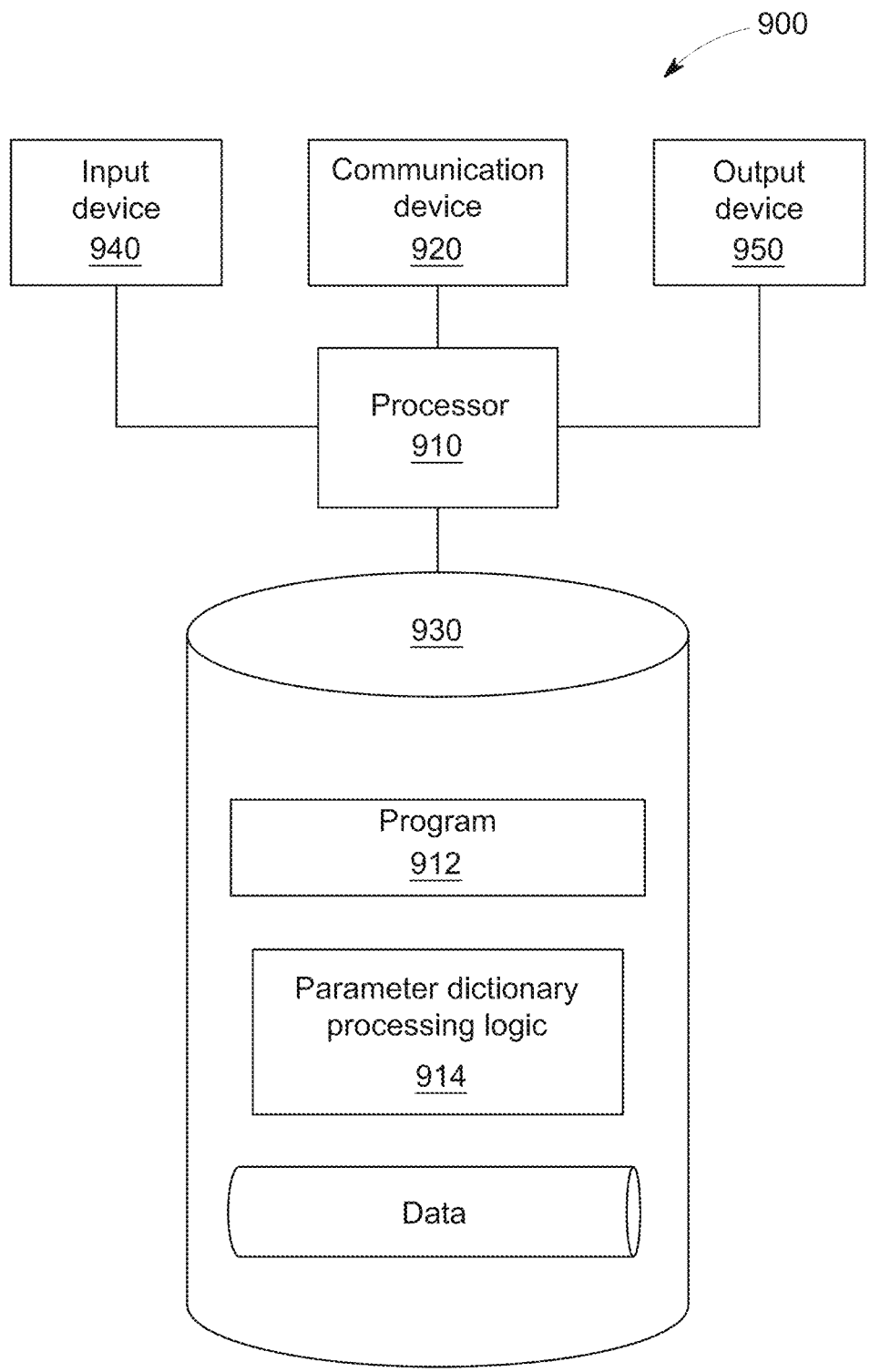

FIG. 9 illustrates s a block diagram of a system according to some embodiments.

DETAILED DESCRIPTION

Because DMLM is a thermal process, an appropriate amount of energy is needed to contact the powder to ensure the powder is melted properly. The melting process controls the quality of the object, and when the powder is not melted properly, the generated object may not have suitable properties, such as an appropriate tensile strength, or the object may have creep resistance. Performing an additive manufacturing build using a parameter set which is fixed for all positions in the geometry of the part may not produce satisfactory results.

For example, during DMLM, the energy applied to the powder, via the laser beams, is either received by the powder material to melt the powder material or is flowing away from the material as thermal leakage. When a material is first received, an analysis may be performed to derive a parameter set for use with that material. The parameter set may include, but is not limited to, laser power, scan speed, laser spot size (focus), layer thickness, hatch spacing, etc. When a design uses a fixed parameter set developed based on the properties of the material being used in the manufacture of the object, this parameter set may work well in bulk regions of the object (i.e., portions having a relatively uniform geometry), which is how it is applied conventionally. However, the fixed parameter set may not work well for an object being manufactured having a complex (i.e., non-uniform geometry). When the object being manufactured has a complex geometry, the thermal leakage may vary across the object, making it difficult to determine an amount of energy to apply to the powder material, such that a uniform amount of energy is received by the object everywhere.

Conventionally, models may be used to estimate thermal leakage for an object. However, even with these models, it may still take weeks or months to estimate the thermal leakage.

Thus, a build performed with a nominal parameter set can result in deficiencies in the material properties. A nominal parameter set can be adjusted in an attempt to improve the properties of the surface of the material. For example, the laser power may be reduced throughout the build or in a segmented region. However, such an adjustment may introduce or increase porosity of the material.

In an iterative learning control (ILC) process, variable corrections or adjustments are applied to the build parameters for predictable disturbances (e.g., to correct laser power level as a function of laser position). With ILC, the corrections may be based on data from sensors 120 located in the AMM, which record data about the heat emission as a function of laser position. Then the ILC process determines a correlation between sensor data and part quality. The correlation may be used to generate an optimal parameter scan set, which may be used in turn to fabricate the object. A challenge with ILC is that while the process may produce an optimized parameter scan set in less time than other conventional (non-ILC) processes, the ILC process still requires the object being built multiple times. When the object is large (e.g., a half meter in diameter), it may be challenging to use an ILC process, as the large part may need to be built several times, and it may still take a relatively long time (e.g., months) to generate an optimized parameter set.

In disclosed embodiments, a dictionary is generated for one or more geometric structures that may form any part from a given material. Each dictionary entry may include optimal parameters for fabricating that geometric structure having a given feature. After the dictionary is generated, a user may refer to the dictionary to generate optimal (or sub-optimal) parameter sets to fabricate the part using additive manufacturing processes and machines. The parameter sets may be for each of the geometric structures used to form the part.

Figure 1:
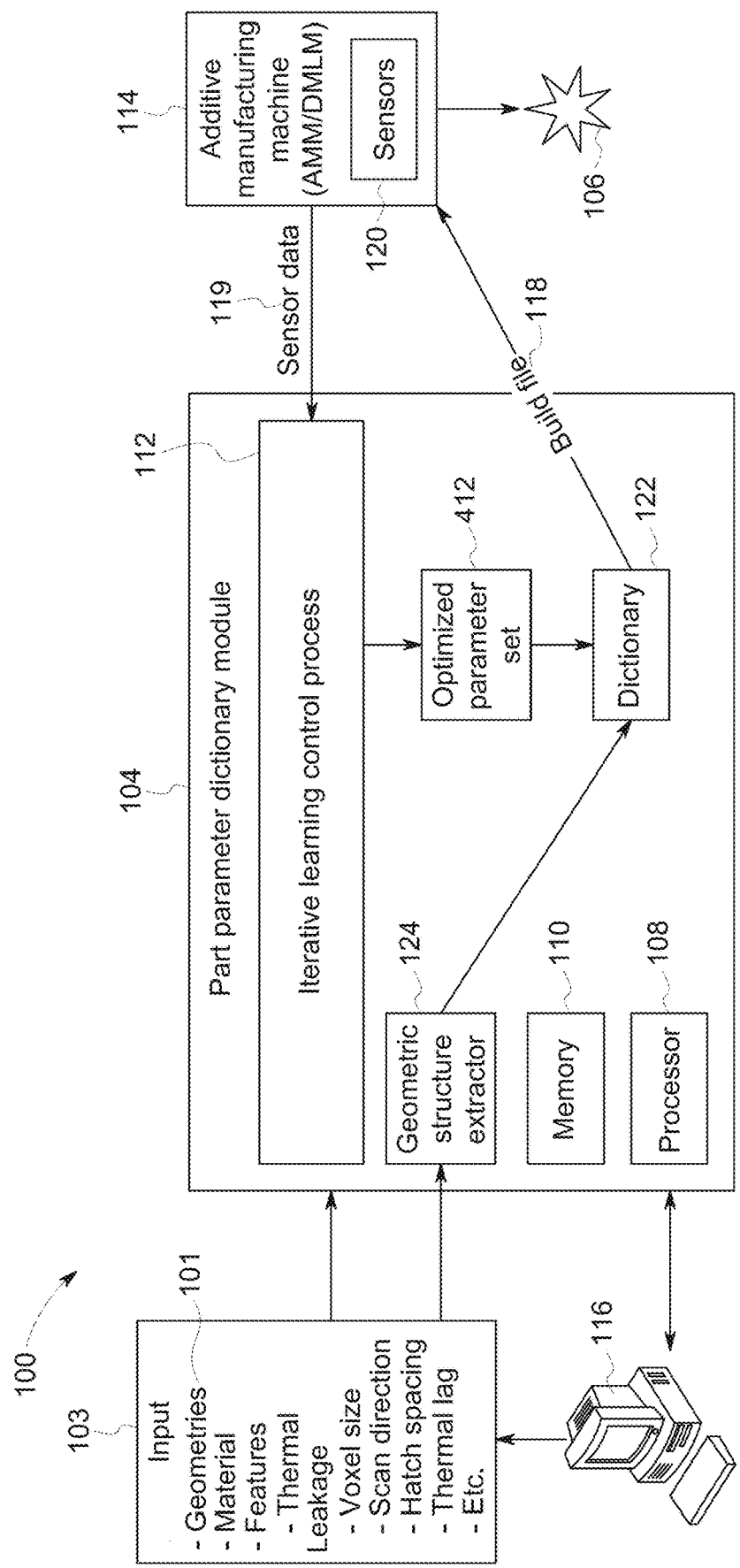
FIG. 1 illustrates a system according to some embodiments.
Figure 2:
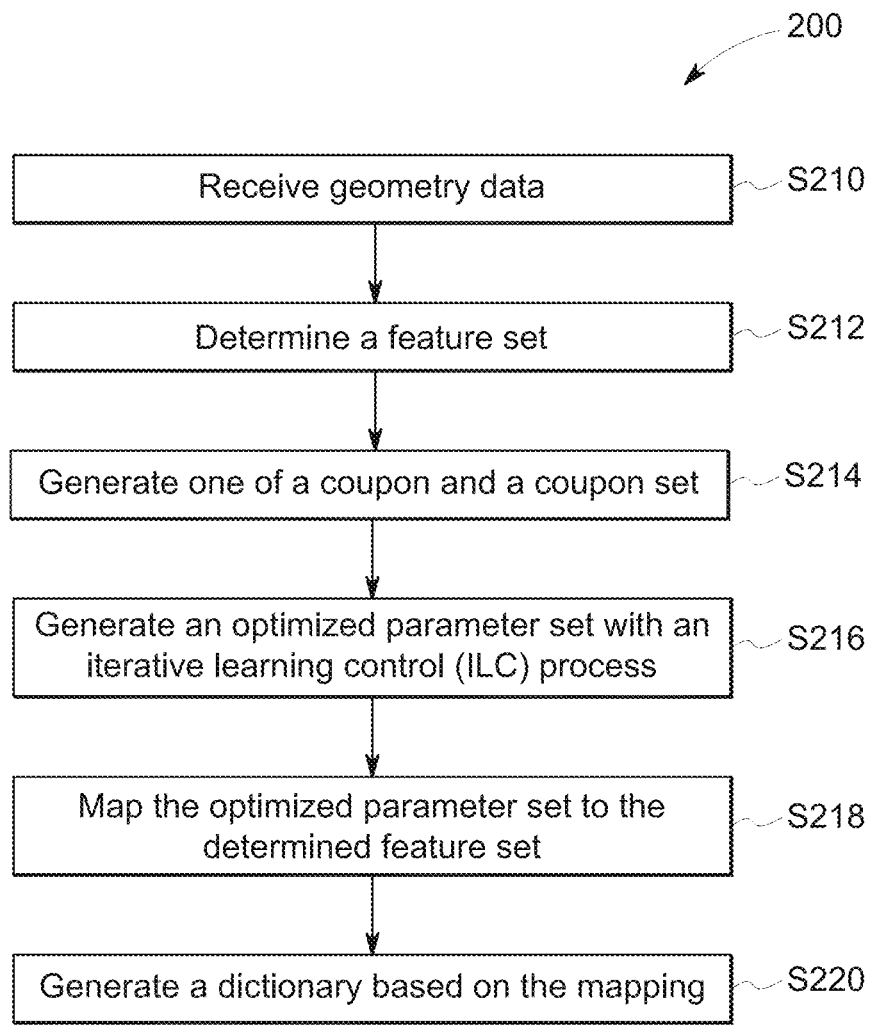
FIG. 2 illustrates a flow diagram according to some embodiments.

Turning to FIGS. 1-8, a system 100 and diagrams of examples of operation according to some embodiments are provided. In particular, FIGS. 2 and 5 provide a flow diagram of a process 200/500, according to some embodiments. Processes 200/500 and other processes described herein may be performed using any suitable combination of hardware (e.g., circuit(s)), software or manual means. In one or more embodiments, the system 100 is conditioned to perform the processes 200/500 such that the system is a special-purpose element configured to perform operations not performable by a general-purpose computer or device. Software embodying these processes may be stored by any non-transitory tangible medium including a fixed disk, a floppy disk, a CD, a DVD, a Flash drive, or a magnetic tape. Examples of these processes will be described below with respect to embodiments of the system, but embodiments are not limited thereto.

Initially, at S210, a set of basis geometries 101 is received at a part parameter dictionary module 104. In one or more embodiments, each part 106 manufactured by an AM process may include one or more geometric structures (e.g., a hole, an arch, trapezoid, overhang geometry, linear thin wall, thin walls concentric, tilt cylinder, helix, round thin wall, overhang sample, overhang open ends, restricted pin, snap block, LCF coupon, etc.). It is noted that the LCF coupon may be a basis geometry for dictionary generation, or it may be used as a validation geometry, and a basis geometry for the LCF bar may be the small arch. It is also noted that validation geometry are geometries that have features similar to those in the full part, but may not be part of the basis geometry. In this way, a dictionary may be constructed based on unrelated parts (e.g., the small arch), but validated on a different part. The set of basis geometries represents one or more geometries for the one or more geometric structures, such that the part may be decomposed into smaller sections/geometric structures for analysis. It is noted that the basis geometries may be sections of a larger part that may be built, and the basis geometries may be selected because they have representative features, or may be one cross section of a part that has repetitive structures. The basis geometries may also be selected for receipt as they are structures that may be known to be more difficult to build in additive manufacturing (e.g., arches, thin walls and other thin structures). It is further noted that when building a dictionary for a complex geometry, as described further below, basis geometries may be selected for inclusion therein that cover the majority of features of the complex geometry. The basis geometries may include known basis geometries, such as those listed above, as well as some representative portion of the complex geometry.

In one or more embodiments, the part parameter dictionary module 104 may include one or more processing elements 108 and a memory 110. The processor 108 may, for example, be a microprocessor, and may operate to control the overall functioning of the part parameter dictionary module 104. In one or more embodiments, the part parameter dictionary module 104 may include a communication controller for allowing the processor 108, and hence the part parameter dictionary module 104, to engage in communication over data networks with other devices (e.g., the additive manufacturing device 114 and user interface 116). In one or more embodiments, the part parameter dictionary module 104 may include one or more memory and/or data storage devices 110, which may comprise any combination of one or more of a hard disk drive, RAM (random access memory), ROM (read only memory), flash memory, etc. The memory/data storage devices 110 may store software that programs the processor 108 and the part parameter dictionary module 104 to perform functionality as described herein.

Then in S212, a feature set 103 is received at the part parameter dictionary module 104. In one or more embodiments, the feature set 103 may be the output of a model. For example, when the feature is thermal leakage, the feature set may be the output of a thermal leakage model, which may include the features that affect the thermal leakage in each voxel. The feature set 103 may include one or more features. A feature 103 is one or more structural aspects of the part that may be assessed. In one or more embodiments, the features are a set of characteristics of a part that affect the thermal properties of a local section (e.g., a voxel) of a part and as a result, influences the melt pool characteristics and material property. Some non-exhaustive examples of features are thermal leakage, voxel size, scan direction, hatch spacing, thermal lag, etc. It is noted that the feature set 103 may be specific for a specific material. Some of the features may be the same regardless of material, but other features may receive a different treatment depending on the material used.

Next, in S214, one of a coupon 304 (FIGS. 3A-C) and a coupon set (e.g., two or more coupons) is generated for the feature set 103 by the part parameter dictionary 104. A coupon, which may also be referred to as a "test coupon," is a representative test sample of the part being manufactured by AM. Coupons may be simple shapes suitable for analysis that contain one or more features 103 and may be representative of the parts being built. In one or more embodiments, the coupons 304 may include all the features required to generate a scan feature file 118 (e.g., "build file") for the part 106. More particularly, in one or more embodiments, the coupons may include a geometric structure (which may be at least a portion of the part) that includes the feature set. In one or more embodiments, each coupon may capture one or more of the features for a geometric structure. In one or more embodiments, a build time (i.e., the time to fabricate) of the coupon may be a fraction of the build time for the part composed of one or more geometric structures.

Turning to FIG. 3C, the Full LFC Bar part 106 is shown as a non-exhaustive example of a part. The Full LFC Bar part 106 may be decomposed into one or more geometric structures 302, and the coupon 304 is generated for each geometric structure 302. In the non-exhaustive example shown herein, the feature set 103 is volume fraction, which is a surrogate for thermal leakage, in that when a 3D geometry is available, it may be voxelized at a certain resolution (e.g., 100 microns) to generate a volume fraction map 306, and the thermal leakage may be determined at each voxel point. In one or more embodiments, the volume fraction/feature set may be output from the execution of a thermal leakage model and received by the part parameter dictionary module 104. The thermal leakage model may calculate the volume fraction within a probe. As shown herein, the color variation in the volume fraction map 306 may mimic the variation of thermal leakage. The bulk of the geometric structure 302 may be the predominant shade at the center and near the top of the image 301, and may have the highest thermal leakage, while towards the bottom 303 of the build plate, where the geometric structure 302 is near the build plate, there is a darker color, and there may be less of an area for the heat to dissipate.

Turning back to the process 200, an Iterative Learning Control (ILC) process 112 is executed to generate an optimized parameter set 412 in S216. The optimized parameter set is a set of parameters to be used to build or generate a geometric part balancing structural concerns (e.g., "optimizing"), for example maintaining both good porosity and surface finish properties. A block diagram 400 of the ILC process 112 is shown in FIG. 4. During the ILC process 112, a geometry file 402 is received. The file may be received from a user, or any other suitable party. The geometry file 402 may then be converted into a build file 404, via any suitable process. In one or more embodiments, the build file may include the features of the geometry file, along with the parameters used to build the part via the AMM 114. Then the AMM 114 builds the part 106. The AMM 114 may include one or more sensors 120 therein that record data 119 during the fabrication of the part. The recoded data may be any data (e.g., camera data) that reflects the melt pool feature. As a non-exhaustive example, the sensor 120 may be a photo-diode that measures heat response from a surface at each location. Other non-exhaustive examples include melt-pool dimensions (e.g., Photodiode (PD), camera, melt-pool depth-optical coherence tomography (OCT), melt-pool cooling rate), PD array, multi-color PD/Camera, etc. The part 106 may then be analyzed during a post process analysis 406 to determine part quality. The sensor data 119 may then be correlated with the part quality data. A determination 408 is made whether the fabricated part is of sufficient quality or if more iterations are needed. The determination may be made by a user or automatically by a machine. If it is determined the quality is sufficient, the geometry and parameters may be output in a final build file 410. The final build file 410 may be a scan file that includes the optimized parameter set 412 for the given geometry for a particular material. If it is determined the quality is insufficient, an updated build file of the geometry and modified parameters may be generated 414 and returned to the AMM 114. The modified parameters may be based on the correlation between the sensor data 119 and the part quality data.

The optimized parameter set 412 is next mapped to the feature set 103 in S218. In one or more embodiments, the mapping may be via a transfer function or any other suitable process. As a non-exhaustive example, for a feature of volume fraction (representing thermal leakage in each voxel), the optimized parameter set is optimized power map. The mapping 600 (FIG. 6) of the feature and parameter set (i.e., the transfer function) is a mapping between a volume fraction level to a corresponding optimized power level. As a non-exhaustive example, FIG. 6 provides a mapping 600 of the optimized parameter set 412 to the feature set 103 for a given geometric structure 302, in this case the Full LCF Bar 106 shown in FIG. 3C. As shown herein, for the Full LCF Bar, the optimized parameter set of power maps to the volume fraction/thermal leakage features. More specifically, the use of optimized parameter to generate the Full LCF Bar with a particular material may result in an optimized voxel point/thermal leakage, (e.g., optimized power map 308 shown in FIGS. 3A-C. This optimized power map 308 may be used to determine the strength of the lasers (or other laser parameters including but not limited to velocity and focus of lasers) to fabricate the part.

The part parameter dictionary module 104 may then use the one or more mappings to generate a dictionary 122. The dictionary 122 may include one or more entries 702. The dictionary 122 may include optimized scan parameter sets to fabricate geometric structures (e.g., laser parameters—the input powers, speeds, focuses, locations of laser strikes through the part). Each entry 702 may include a volume fraction as a key and parameter sets as values associated with the keys. The parameter sets may include power, speed, focus (spot size), etc. or any other suitable parameters. In one or more embodiments, the parameters forming the parameter sets included in the dictionary may have been optimized by the ILC process described herein. A non-exhaustive example of a dictionary 122 including one or more entries 702 is shown in FIG. 7.

In one or more embodiments, the dictionary may be output to a user platform 116 (a control system, a desktop computer, a laptop computer, a personal digital assistant, a tablet, a smartphone, etc.) to view information about and/or manage the operation of the AM device in accordance with any of the embodiments described herein. In one or more embodiments, the dictionary entries may be used to control the AMM to fabricate the parts. In one or more embodiments, the dictionary (including the entries) output from the parameter dictionary module 104 may be transmitted to various user platforms or to other systems (not shown), as appropriate (e.g., for display to, and manipulation by, a user).

In some instances, a part may have a build requirement for a plurality of support and supporting contacts on its surface to provide and sustain different force bearing competences at these contacts (e.g., compression and torque shear stress). In one or more embodiments, in addition to entries including optimized parameters for a geometric structure, the dictionary 800, shown in FIG. 8, may also include, for each geometric structure 302, entries 802 (FIG. 8) for coupons generated with different characteristics or outcomes (e.g., material quality—weaker but still acceptable strength or durability compared to the best coupons that could be built) that may be built faster, for example, and still meet the requirements of that particular build. Non-exhaustive examples of material quality metrics are LCF life, porosity, surface finish, creep resistance, cracking, etc. These different characteristics may provide for a part to be built with sub-optimal characteristics (e.g., the above-mentioned weaker but still acceptable strength or durability compared to the best coupons that could be built). An advantage of selecting an entry, as described further below, with sub-optimal characteristics, is that fabrication of a part with this entry may take less time than with an entry associated with optimal characteristics. As such, a product may be built that is "good enough", i.e., sufficient to meet the user's requirements, without being optimal in terms of quality of the part.

In one or more embodiments, the different characteristic coupons may have mutually differing region-specific microstructures. This can be accomplished if, for example, the coupon build process applies a different energy density. Also, the laser scanning sequences may influence a coupon's thermal profile.

As a non-exhaustive example, porosity may be a characteristic that may influence the build time of a coupon. If not appropriately limited, porosity may affect a coupon's monotonic strength and expected time to fatigue failure. To nearly eliminate porosity, each layer of the coupon may be re-melted and the coupon's density maximized. This may significantly increase the production time and cost of that coupon's section of the part. While full density (i.e., lack of porosity), may be an ideal condition, not all coupons of a part may require it, as the part may still be certified for its intended use with less than full density, and its time to production reduced slightly in a shorter build time, which may result in a greater profit per unit time.

In one or more embodiments, the entries 802 different characteristic coupons may be generated by the part parameter dictionary module 104, for example. Each different entry 802, may include minor adjustments to the build files for the optimized geometric structure.

Turning to FIG. 5, a process 500 for using the dictionary 122 to determine a parameter set and generate a build file 118 for fabricating a part using a specific material is provided.

Initially, at S510, a file including a part to be fabricated by the AMM 114 is received at the part parameter dictionary module 104. Then, in S512, a geometric structure extractor 124 may decompose the part 106 into one or more geometric structures 302. One or more embodiments may use volume fraction, segmentation or any other suitable process for decomposition. The part parameter dictionary module 104 may then assign each of the geometric structure to one or more voxels in S514. It is noted that assignment to voxels is a non-exhaustive example related to the thermal leakage feature. For other features (e.g., scan direction, thermal lag, etc.), the part parameter dictionary module 104 may assign each of the geometric structures to voxels or hatch lines or any other suitable component of the scan file. As described above, features are a set of common fundamental characteristics to represent a larger class of elements. For example, straight lines and arcs may be the features used to represent a wide range of geometric drawings; and thermal leakage, thermal lag, scan direction, laser incident angles, shape of trajectory, etc., may be features to represent a wide set of geometric structures. The dictionary 122 is queried in S516 for a first of the assigned voxels for a first geometric structure 302, and returns the entry 702, (including optimized parameter set), for the assigned voxel. It is then determined in S518 whether there are more assigned voxels. When there are more assigned voxels in S518, the process returns to S516. When there are no more assigned voxels in S518, the process proceeds to S520, and it is determined whether there are more geometric structures. When there are more geometric structures in S520, the process returns to S516 and is iterated for the next geometric structure. When there are no more geometric structures in S520, the part parameter dictionary module 104 may output an optimal parameter set for the part 106 as a build file 118, in S522 including the parameter set for each geometric structure. In one or more embodiments, the build file 118 may be received by the AMM 114, and/or the user platform 116. It is noted that while the process 500 is described herein with respect to outputting an optimal parameter set, when the file is received in S510, or at another point prior to querying the dictionary, the part parameter dictionary module 104 may receive as an input selection a request for the returned output to be that of a sub-optimal parameter set, as described above. In one or more embodiments, the sub-optimal parameter sets may be returned to the user platform 116 with the optimal parameter set, giving the user the option to decide which build file to transmit to the AMM 114 for fabrication of the part 106.

Note the embodiments described herein may be implemented using any number of different hardware configurations. For example, FIG. 9 illustrates a part parameter dictionary processing platform 900 that may be, for example, associated with the system 100 of FIG. 1. The part parameter dictionary processing platform 900 comprises a part parameter dictionary processor 910 ("processor"), such as one or more commercially available Central Processing Units (CPUs) in the form of one-chip microprocessors, coupled to a communication device 920 configured to communicate via a communication network (not shown in FIG. 9). The communication device 920 may be used to communicate, for example, with one or more users. The part parameter dictionary processing platform 900 further includes an input device 940 (e.g., a mouse and/or keyboard to enter information about the part) and an output device 950 (e.g., to output and display the data and/or recommendations).

The processor 910 also communicates with a memory/storage device 930. The storage device 930 may comprise any appropriate information storage device, including combinations of magnetic storage devices (e.g., a hard disk drive), optical storage devices, mobile telephones, and/or semiconductor memory devices. The storage device 930 may store a program 912 and/or part parameter dictionary processing logic 914 for controlling the processor 910. The processor 910 performs instructions of the programs 912, 914, and thereby operates in accordance with any of the embodiments described herein. For example, the processor 910 may receive input and then may apply the part parameter dictionary module 104 via the instructions of the programs 912, 914 to generate a build file for fabrication of a part.

The programs 912, 914 may be stored in a compressed, uncompiled and/or encrypted format. The programs 912, 914 may furthermore include other program elements, such as an operating system, a database management system, and/or device drivers used by the processor 910 to interface with peripheral devices.

As used herein, information may be "received" by or "transmitted" to, for example: (i) the platform 900 from another device; or (ii) a software application or module within the platform 900 from another software application, module, or any other source.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a part parameter dictionary module. The method steps can then be carried out using the distinct software modules and/or sub-modules of the system, as described above, executing on one or more hardware processors 910 (FIG. 9). Further, a computer program product can include a computer-readable storage medium with code adapted to be implemented to carry out one or more method steps described herein, including the provision of the system with the distinct software modules.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

The invention claimed is:

1. A method comprising:
   decomposing, in response to a request for a parameter set for fabricating a part having a three-dimensional (3D) geometry using additive manufacturing, the part into one or more geometric structures;
   assigning each of the geometric structures to one or more voxels based on a thermal leakage feature;
   generating, using a part parameter dictionary, a parameter set for the one or more assigned voxels; and
   outputting the parameters in a build file to an additive manufacturing machine to produce the part.

2. The method of claim 1, further including generating the parameter set for the one or more assigned voxels using the part parameter dictionary, wherein the part parameter dictionary contains parameter sets corresponding to geometric structures in unspecified parts.

3. The method of claim 1, further including generating the parameter set including at least one of laser power, scan speed, laser spot size, laser beam intensity profile, layer thickness, or hatch spacing.

4. The method of claim 1, further including generating the parameter set based on balancing at least two structural properties of the part.

5. The method of claim 4, further including generating the parameter set via application of a transfer learning algorithm.

6. The method of claim 1, further including decomposing the part based on one or more of volume fraction and segmentation.

7. A system comprising:
   a part parameter dictionary module including a processor; and
   a memory storing program instructions, the part parameter dictionary module operative with the program instructions to perform functions as follows:
     decomposing, in response to a request for a parameter set for fabricating a part having a three-dimensional (3D) geometry using additive manufacturing, the part into one or more geometric structures;
     assigning each of the geometric structures to one or more voxels based on a thermal leakage feature;
     generating, using a part parameter dictionary, a parameter set for the one or more assigned voxels; and
     outputting the parameters in a build file to an additive manufacturing machine to produce the part.

8. The system of claim 7, wherein the part parameter dictionary contains parameter sets corresponding to geometric structures in unspecified parts.

9. The system of claim 7, wherein the parameter set including at least one of laser power, scan speed, laser spot size, laser beam intensity profile, layer thickness, or hatch spacing.

10. The system of claim 7, where in the parameter set is generated based on balancing at least two structural properties of the part.

11. The system of claim 10, wherein the parameter set is generated via application of a transfer learning algorithm.

12. A non-transitory computer-readable medium storing instructions that, when executed by a computer processor, cause the computer processor to perform a method comprising:
    decomposing, in response to a request for a parameter set for fabricating a part having a three-dimensional (3D) geometry using additive manufacturing, the part into one or more geometric structures;
    assigning each of the geometric structures to one or more voxels based on a thermal leakage feature;
    generating, using a part parameter dictionary, a parameter set for the one or more assigned voxels; and
    outputting the parameters in a build file to an additive manufacturing machine to produce the part.

13. The medium of claim 12, wherein the part parameter dictionary contains parameter sets corresponding to geometric structures in unspecified parts.

14. The medium of claim 12, wherein the parameter set including at least one of laser power, scan speed, laser spot size, laser beam intensity profile, layer thickness, or hatch spacing.

15. The medium of claim 12, where in the parameter set is generated based on balancing at least two structural properties of the part.

16. The medium of claim 15, wherein the parameter set is generated via application of a transfer learning algorithm.

17. The medium of claim 12, wherein the part is decomposed based on one or more of volume fraction and segmentation.

* * * * *